United States Patent
Kashefi et al.

(10) Patent No.: US 9,337,238 B1
(45) Date of Patent: May 10, 2016

(54) PHOTO-INDUCED MSM STACK

(71) Applicant: Intermolecular, Inc., San Jose, CA (US)

(72) Inventors: Kevin Kashefi, San Ramon, CA (US);
Ashish Bodke, San Jose, CA (US);
Mark Clark, Santa Clara, CA (US);
Prashant B. Phatak, San Jose, CA (US);
Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/524,801

(22) Filed: Oct. 27, 2014

(51) Int. Cl.
| | |
|---|---|
| H01L 27/24 | (2006.01) |
| H01L 33/50 | (2010.01) |
| H01L 33/32 | (2010.01) |
| H01L 33/30 | (2010.01) |
| H01L 33/28 | (2010.01) |
| H01L 33/40 | (2010.01) |

(52) U.S. Cl.
CPC .......... *H01L 27/2409* (2013.01); *H01L 33/285* (2013.01); *H01L 33/30* (2013.01); *H01L 33/32* (2013.01); *H01L 33/40* (2013.01); *H01L 33/502* (2013.01)

(58) Field of Classification Search
None
See application file for complete search history.

(56) References Cited

U.S. PATENT DOCUMENTS

| | | | |
|---|---|---|---|
| 2005/0051777 A1* | 3/2005 | Hill | B82Y 20/00 257/72 |
| 2011/0242873 A1* | 10/2011 | Bratkovski | G11C 13/0007 365/112 |
| 2012/0012810 A1* | 1/2012 | Thylen | G11C 7/005 257/4 |
| 2014/0353579 A1* | 12/2014 | Greco | G01N 33/588 257/13 |

* cited by examiner

*Primary Examiner* — William Coleman
*Assistant Examiner* — Kien Ly

(57) ABSTRACT

Selector elements that can be suitable for nonvolatile memory device applications are disclosed. The selector element can have low leakage currents at low voltages to reduce sneak current paths for non-selected devices, and higher leakage currents at higher voltages to minimize voltage drops during device switching. The selector element can be based on multilayer film stacks (e.g. metal-semiconductor-metal (MSM) stacks). The semiconductor layer of the selector element can include a photo-luminescent or electro-luminescent material. Conductive materials of the MSM may include tungsten, titanium nitride, carbon, or combinations thereof.

20 Claims, 11 Drawing Sheets

PHOTO-INDUCED MSM STACK

FIELD OF THE DISCLOSURE

This invention relates generally to nonvolatile memory elements, and more particularly, to methods for forming selector elements used in nonvolatile memory devices.

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including magnetoresistive random access memory (MRAM), ferroelectric random access memory (FRAM), phase change memory (PCM), spin transfer torque random access memory (STT-RAM), and resistive random access memory (ReRAM), among others.

Resistive memory devices are formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Non-destructive read operations can be performed to ascertain the value of a data bit that is stored in a memory cell.

Resistive switching based on transition metal oxide switching elements formed of metal oxide films has been demonstrated. Although metal oxide films such as these exhibit bistability, the resistance of these films and the ratio of the high-to-low resistance states are often insufficient to be of use within a practical nonvolatile memory device. For instance, the resistance states of the metal oxide film should preferably be significant as compared to that of the system (e.g., the memory device and associated circuitry) so that any change in the resistance state change is perceptible. The variation of the difference in resistive states is related to the resistance of the resistive switching layer. Therefore, a low resistance metal oxide film may not form a reliable nonvolatile memory device. For example, in a nonvolatile memory that has conductive lines formed of a relatively high resistance metal such as tungsten, the resistance of the conductive lines may overwhelm the resistance of the metal oxide resistive switching element. Therefore, the state of the bistable metal oxide resistive switching element may be difficult or impossible to sense. Furthermore, the parasitic resistance (or the parasitic impedance, in the actual case of time-dependent operation), (e.g. due to sneak current paths that exist in the system), may depend on the state of the system, such as the data stored in other memory cells. It is often preferable that the possible variations of the parasitic impedance be unsubstantial compared to the difference in the values of the high and low resistance of a memory cell.

Similar issues can arise from integration of the resistive switching memory element with current selector elements (also known as current limiter or current steering elements), such as diodes and/or transistors. Control elements (e.g. selector devices) in nonvolatile memory structures can screen the memory elements from sneak current paths to ensure that only the selected bits are read or programmed. Schottky diode can be used as a selector device, which can include p-n junction diode or metal-semiconductor diode, however, this requires high thermal budget that may not be acceptable for 3-dimensional (3D) memory application. Metal-Insulator-Metal Capacitor (MIMCAP) tunneling diodes may have a challenge of providing controllable low barrier height and low series resistance. In some embodiments, the control element can also function as a current limiter or control element. In some embodiments, a control element can suppress large currents without affecting acceptable operation currents in a memory device. For example, a control element can be used with the purpose of increasing the ratio of the measured resistances in the high and low resistance state, further making the non-volatile memory device less susceptible to the noise due to parasitic impedances in the system.

Therefore, there is a need for a selector element that can meet the design criteria for advanced memory devices.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, selector elements that can be suitable for nonvolatile memory device applications are disclosed. The selector element can have low leakage currents at low voltages to reduce sneak current paths for non selected devices, and higher currents at higher voltages to minimize voltage drops during device switching. The selector element can be based on multilayer film stacks (e.g. metal-semiconductor-metal (MSM) stacks). The semiconductor layer of the selector element can include a photo-luminescent or electro-luminescent material. Conductive materials of the MSM may include tungsten, titanium nitride, carbon, or combinations thereof.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

2B illustrates the same type of a plot for a bipolar ReRAM cell, in accordance with some embodiments.

Figure 3:
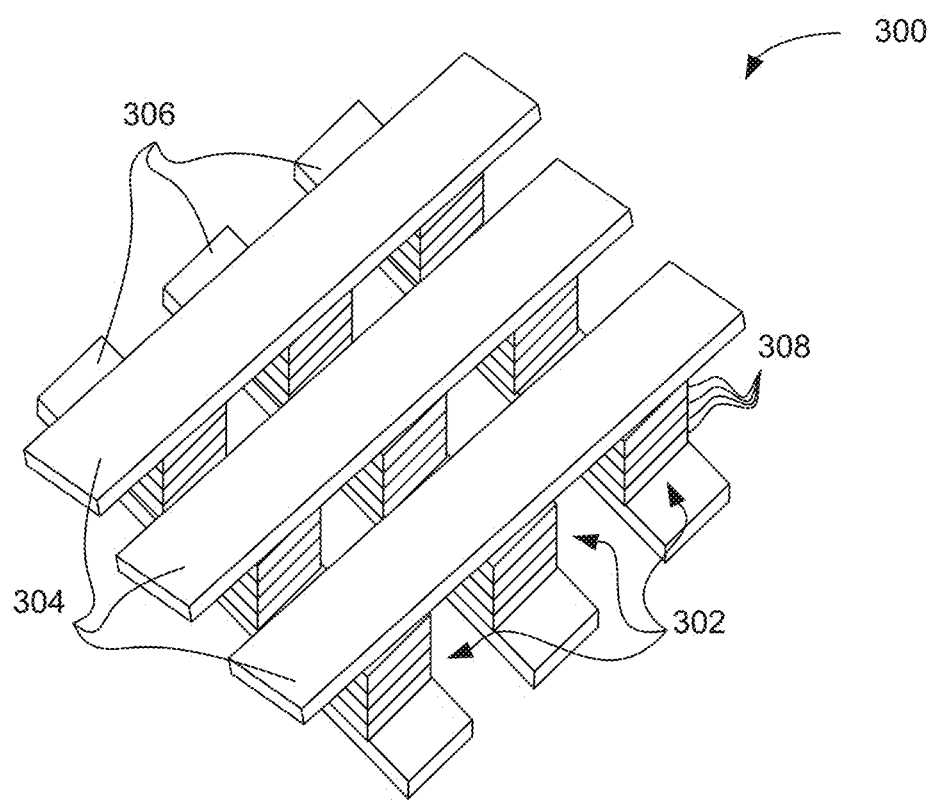

FIG. 3 illustrates a memory array of resistive switching memory elements according to some embodiments.

Figure 4:
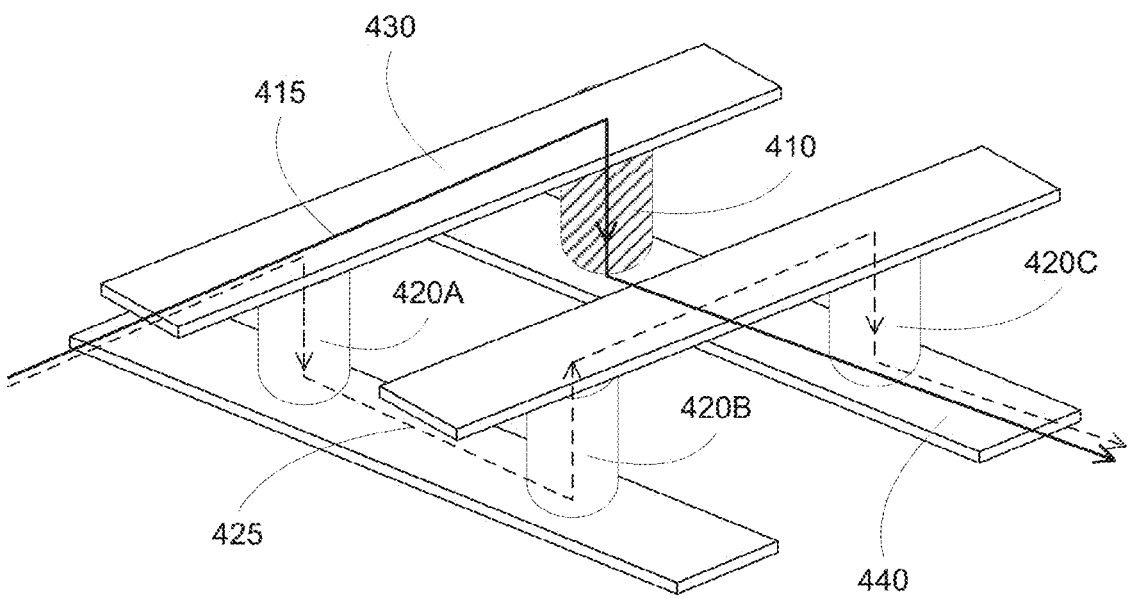

FIG. 4 illustrates sneak path currents in a cross point memory array according to some embodiments.

Figure 5:
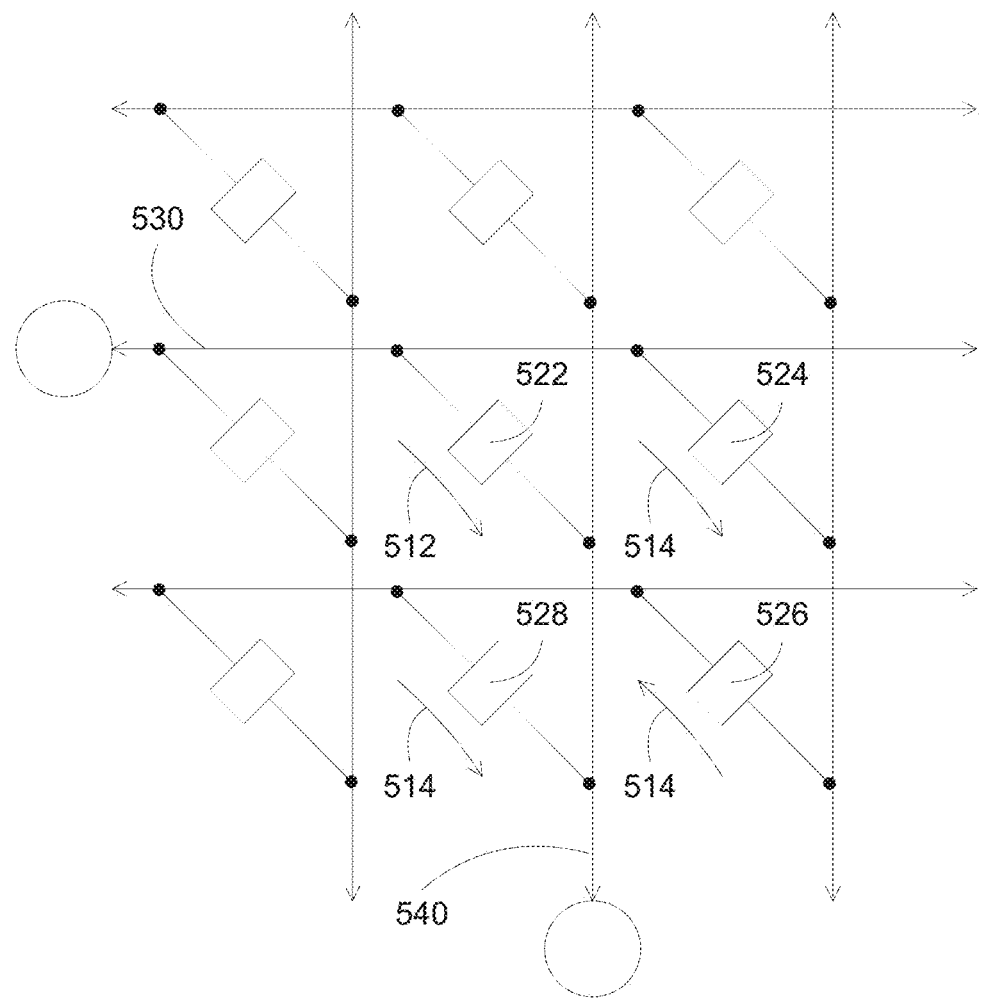

FIG. 5 illustrates sneak path currents in a cross point memory array according to some embodiments.

Figure 6A:
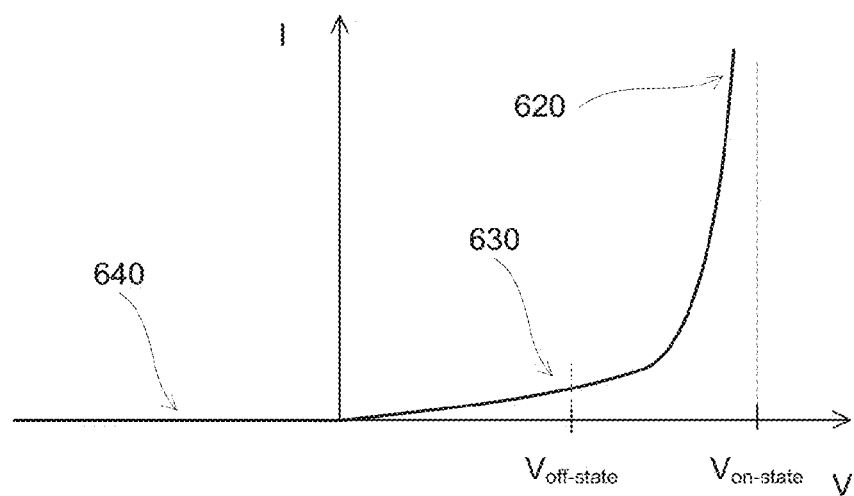
Figure 6B:
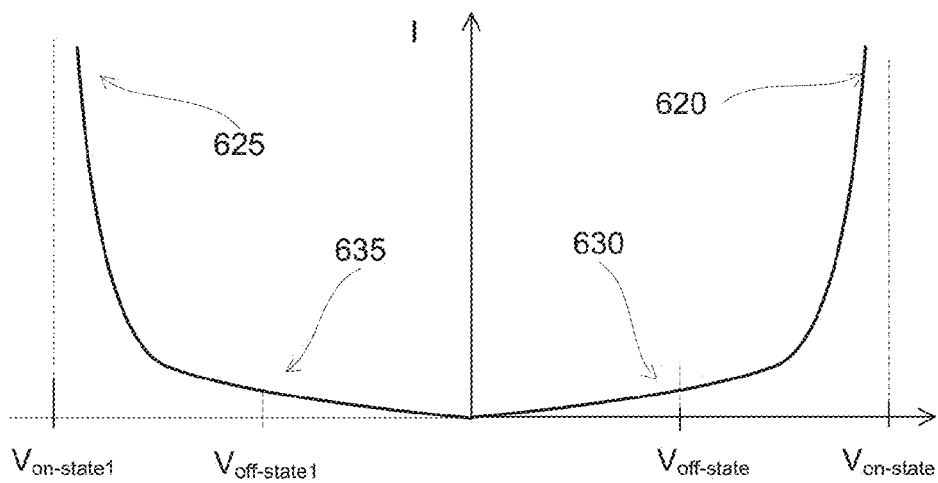

FIGS. 6A-6B illustrate examples of I-V response for a control element according to some embodiments.

Figure 7:
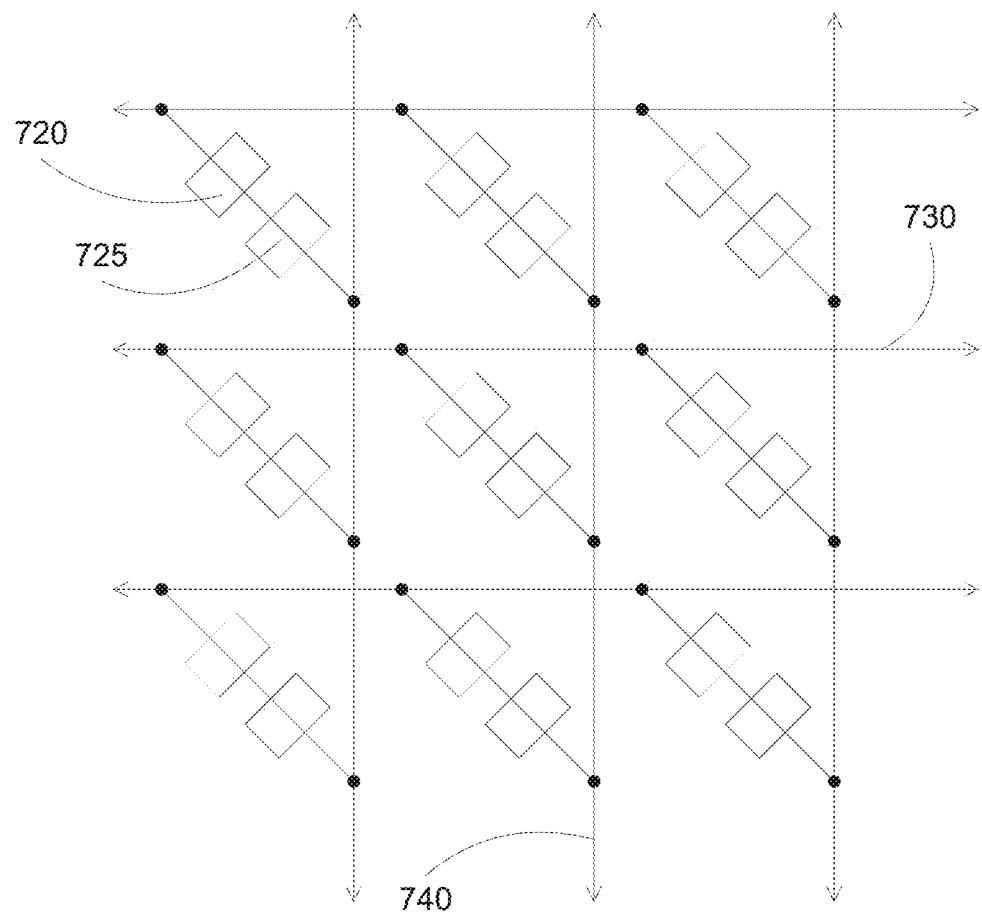

FIG. 7 illustrates a cross point memory array according to some embodiments.

Figure 8A:
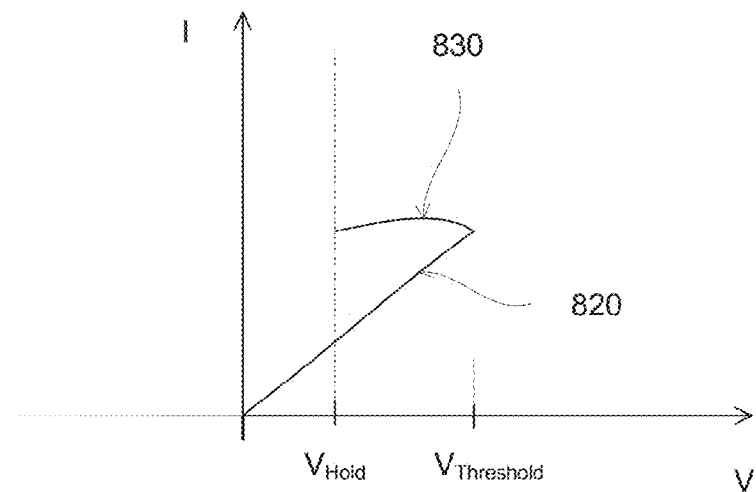
Figure 8B:
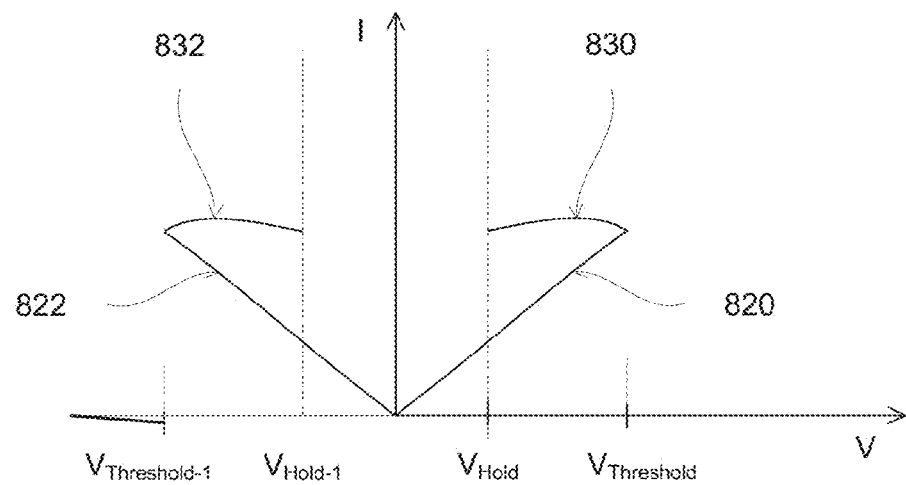

FIGS. 8A-8B illustrate examples of I-V response for a control element according to some embodiments.

Figure 9:
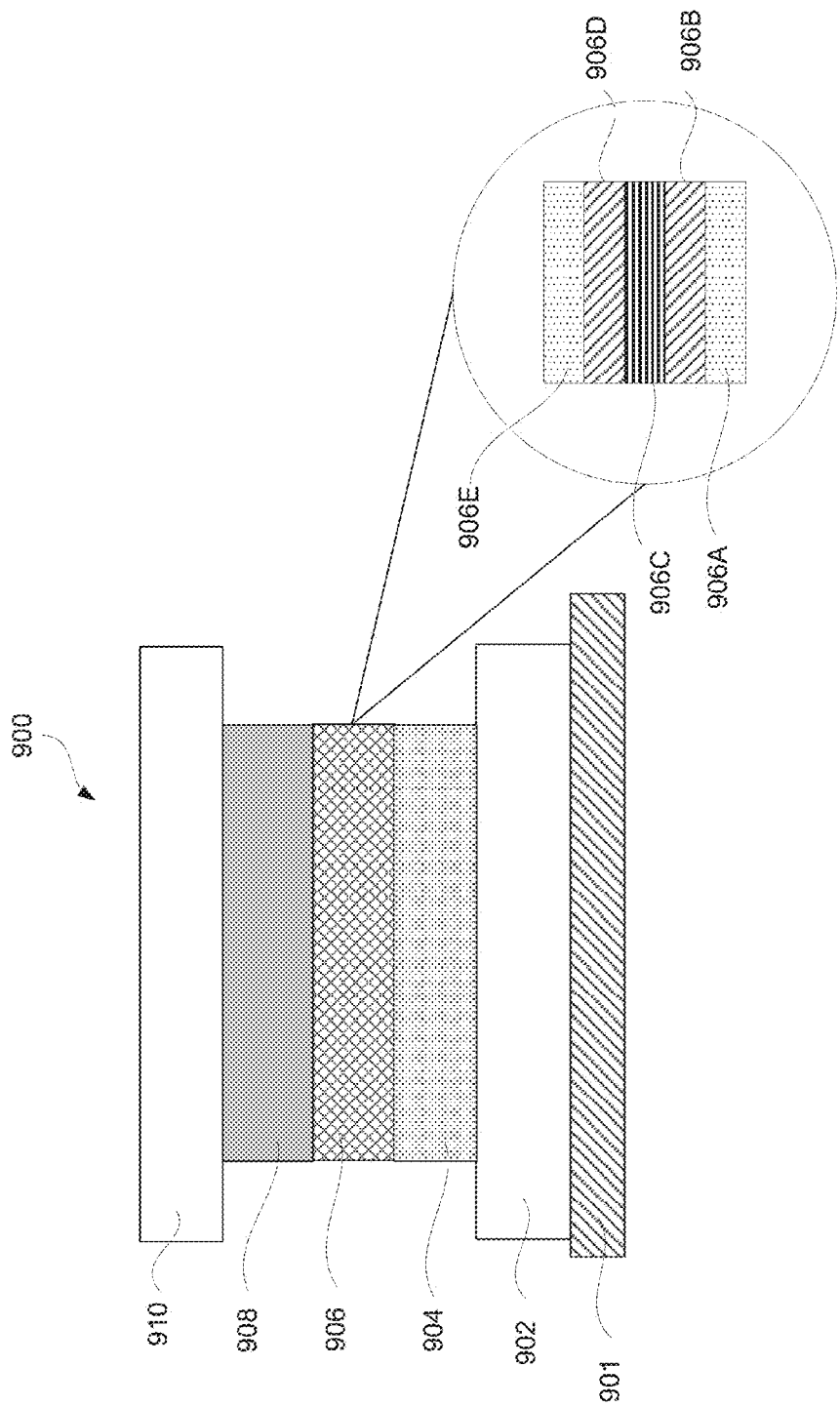

FIG. 9 illustrates an example of an NVM cell according to some embodiments.

Figure 10:
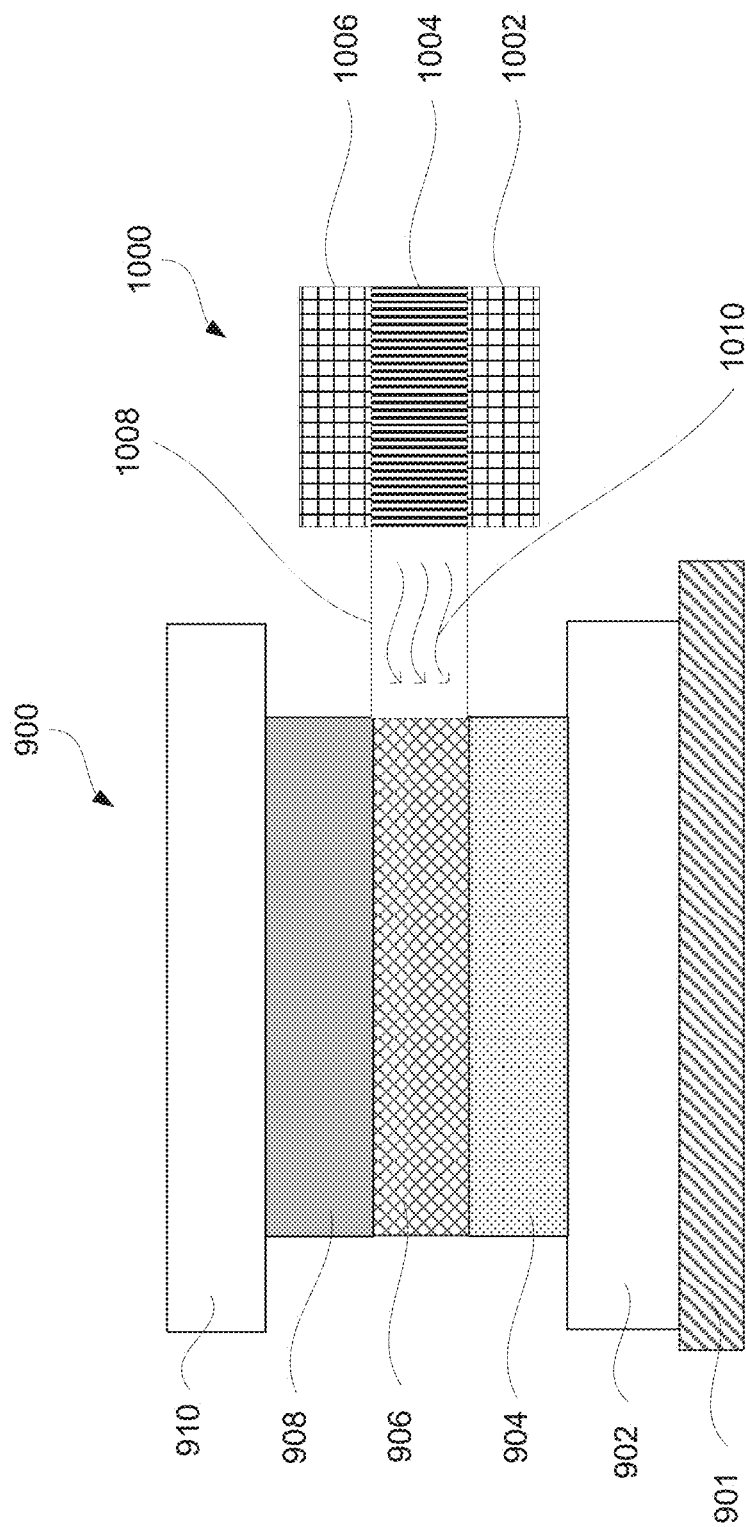

FIG. 10 illustrates an example of an NVM cell according to some embodiments.

Figure 11:
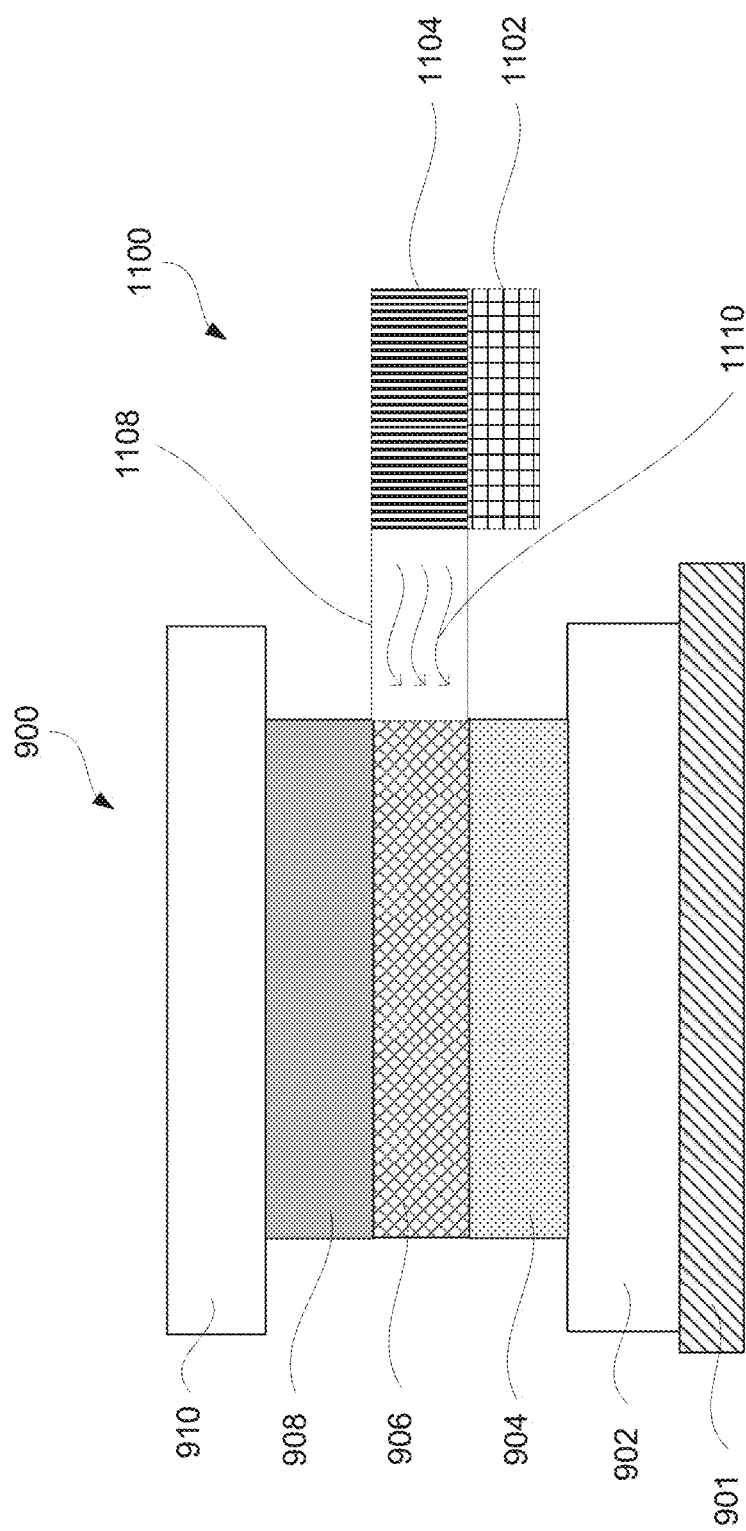

FIG. 11 illustrates an example of an NVM cell according to some embodiments.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%.

As used herein, the term "substantially" generally refers to ±5% of a stated value.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, a material (e.g. a dielectric material or an electrode material) will be considered to be "crystalline" if it exhibits greater than or equal to 30% crystallinity as measured by a technique such as x-ray diffraction (XRD).

The term "substrate" as used herein may refer to any workpiece on which formation or treatment of material layers is desired. Non-limiting examples include silicon, germanium, silica, sapphire, zinc oxide, silicon carbide, aluminum nitride, gallium nitride, Spinel, silicon on oxide, silicon carbide on oxide, glass, gallium nitride, indium nitride, aluminum nitride, glasses, combinations or alloys thereof, and other solid materials.

As used herein, the notation "Si—N" and "SiN" and "$SiN_x$" will be understood to be equivalent and will be used interchangeably and will be understood to include a material containing these elements in any ratio. Where a specific composition is discussed, the atomic concentrations (or ranges) will be provided. The notation is extendable to other materials and other elemental combinations (e.g. Mo—O—N, MoON, $MoON_x$, etc.) discussed herein.

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, the term "between" (when used with a range of values) will be understood to mean that both boundary values and any value between the boundaries can be within the scope of the range.

As used herein, the terms "first," "second," and other ordinals will be understood to provide differentiation only, rather than imposing any specific spatial or temporal order.

As used herein, the term "oxide" (of an element) will be understood to include additional components besides the element and oxygen, including but not limited to a dopant or alloy.

As used herein, the term "nitride" (of an element) will be understood to include additional components besides the element and nitrogen, including but not limited to a dopant or alloy.

As used herein, the term "carbide" (of an element) will be understood to include additional components besides the element and carbon, including but not limited to a dopant or alloy.

Dopants can be added to the dielectric material to increase the k-value and/or decrease the leakage current. As used herein, the dopant may be electrically active or not electrically active. The definition excludes residues and impurities such as carbon, etc. that may be present in the material due to inefficiencies of the process or impurities in the precursor materials. The concentration of the dopant is one factor that affects the crystallinity of the material. Other factors that affect the crystallinity of the material comprise annealing time, annealing temperature, film thickness, etc. Generally, as the concentration of the dopant is increased, the crystallization temperature of the material increases.

Dopants can be added to an electrode material to alter the resistivity and/or influence the crystallinity. As used herein, the dopant may be electrically active or not electrically active. The definition excludes residues and impurities such as carbon, etc. that may be present in the material due to inefficiencies of the process or impurities in the precursor materials. The concentration of the dopant is one factor that affects the crystallinity of the material. Other factors that affect the crystallinity of the material comprise annealing time, annealing temperature, film thickness, etc.

The term "nanolaminate", as used herein, will be understood to be defined as a material or layer that is formed from the deposition of a plurality of sub-layers. Typically, the sub-layers include different materials and the different sub-layers are alternated in a predetermined ratio of thicknesses and/or compositions.

As used herein, the term "inert gas" will be understood to include noble gases (He, Ne, Ar, Kr, Xe) and, unless the text or context excludes it (e.g., by describing nitride formation as undesirable), nitrogen ($N_2$).

As used herein, the term "monolayer" will be understood to include a single layer of atoms or molecules covering a surface, with substantially all available bonding sites satisfied and substantially all individual members of the adsorbed species in direct physical contact with the underlying surface.

As used herein, the term "sub-monolayer" or "pre-wetting layer" will be understood to include a partial or incomplete monolayer; maximum thickness is one atom or molecule, but not all available bonding sites on the surface are covered, so that the average thickness is less than one atom or molecule.

As used herein, the term "Surface" will be understood to describe the boundary between the ambient environment and a feature of the substrate.

Capacitor stacks are formed from a number of deposited thin films. Generally, a deposited thin film may be amorphous, crystalline, or a mixture thereof. Furthermore, several different crystalline phases may exist. Therefore, processes (both deposition and post-treatment) must be developed to maximize the formation of the desired composition and crystalline phase of the thin film. The thin films used to form the capacitor stack may be formed using any common technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the capacitor structure, ALD, PE-ALD, AVD, or CVD are preferred methods of formation. However, any of these techniques are suitable for forming each of the various materials discussed below. Those skilled in the art will appreciate that the teachings described below are not limited by the technology used for the deposition process.

As used herein, elements described or labeled by the phrases "control element", "selector", "selector element", "current limiter", and "current steering device" will be understood to be equivalent and will be used interchangeably.

As used herein, the phrase "sneak current" and "sneak-through current" will be understood to be equivalent and will be used interchangeably and will be understood to refer to current flowing through non-selected memory cells during a read operation.

A cross-bar architecture is promising for future non-volatile memories such as magnetic random access memory (MRAM), ferroelectric random access memory (FRAM), phase change memory (PCM), spin transfer torque random access memory (STT-RAM), or resistive random access memory (ReRAM) because of the small cell size of $4F^2$ achievable with each cell at the intersections of perpendicular word lines and bit lines, and the potential to stack multiple layers to achieve very high memory density. Two key challenges for the cross bar architecture are the possibility of current sneak-through paths (e.g., when trying to read a cell in a high resistance state adjacent to cells in a low resistance state) and the need to avoid unselected cell modification when half of the switching voltage is applied to the selected cell In some embodiments, current selectors are provided with a non-linear current-voltage (I-V) behavior, including low current at low voltages and high current at higher voltages. Unipolar selectors can be appropriate for a unipolar memory such as PCM whereas bipolar selectors can be more appropriate for a bipolar memory such as ReRAM and STT-RAM. The unipolar selector can have high resistance in reverse polarity. Both the unipolar and the bipolar selectors can have high resistance at low voltages. These selectors can prevent sneak-through current, even when adjacent memory elements are in low-resistance state. Furthermore, the non-linear I-V can also provide the current selector with low resistance at higher voltages so that there is no significant voltage drop across the current selector during switching.

In some embodiments, current selectors requiring low temperature processing (e.g., <650 C) are provided, which can be suitable for emerging non-volatile memory architectures such as ReRAM, PCM and STT-RAM. In addition, the current selectors can include fab-friendly materials and can exhibit desired device performance.

In some embodiments, metal-semiconductor-metal (MSM) stacks are provided as bipolar current selectors with low leakage at low voltages and higher leakage at higher voltages. The "M" material may be a metal or conductive compound (e.g. titanium nitride). For example, the semiconductor layer can have a graded band gap, (e.g., formed as a nanolaminate of two materials), so that at low applied voltages, the effective thickness of the semiconductor layer, accounted for the band bending effect due to the applied voltage, can remain large enough to prevent high tunneling or thermionic current. The graded band gap can be further configured so that at low applied voltages, the effective thickness of the semiconductor layer can be adequate to allow high tunneling or thermionic current.

In the following discussion, a ReRAM device will be used as an example of a NVM technology. However, those skilled in the art will understand that the selector element(s) discussed herein can be applied to the other NVM technologies discussed previously.

A ReRAM cell exhibiting resistive switching characteristics generally includes multiple layers formed into a stack. The structure of this stack is sometimes described as a Metal-Insulator-Metal (MIM) structure. Specifically, the stack includes two conductive layers operating as electrodes. These layers may include metals and/or other conductive materials. The stack also includes an insulator layer disposed in between the electrode. The insulator layer exhibits resistive switching properties characterized by different resistive states of the material forming this layer. As such, this insulator layer is often referred to as a resistive switching layer. These resistive states may be used to represent one or more bits of information. The resistance switching properties of the insulator layer are believed to depend on various defects' presence and distribution inside this layer. For example, different distributions of oxygen vacancies in the layer may reflect different resistance states of the layer, and these states may be sufficiently stable for memory application.

To achieve a certain concentration of defects in the resistance switching layer, the layer has been conventionally deposited with defects already present in the layer, (i.e., with preformed defects). In other words, defects are introduced into the layer during its formation. For example, tightly controlled Atomic Layer Deposition (ALD), Physical Vapor Deposition (PVD), or other low-temperature process to comply with a Back End of Line (BEOL) thermal budget may be used to deposit the insulator layer of the stack.

The resistive switching layer changes its resistive state when a switching voltage (e.g., a set voltage or a reset voltage) is applied to this layer as further explained below. The applied voltage causes localized heating within the layer and/or at one or both of its interfaces with other components. Without being restricted to any particular theory, it is believed that a combination of the electrical field and localized heating (both created by the applied voltage) causes formation or breakage of various conductive paths within the resistive switching layer and/or at its interfaces. These conductive paths may be established or broken by moving defects (e.g., oxygen vacancies) within the resistive switching layer and through one or more interfaces that the resistive switching layer forms with adjacent layers.

A brief description of ReRAM cells and their switching mechanisms is provided for better understanding of various features and structures associated with methods of forming nonvolatile memory elements further described below. ReRAM is a non-volatile memory type that includes dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, or other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying switching voltages.

Figure 1A:
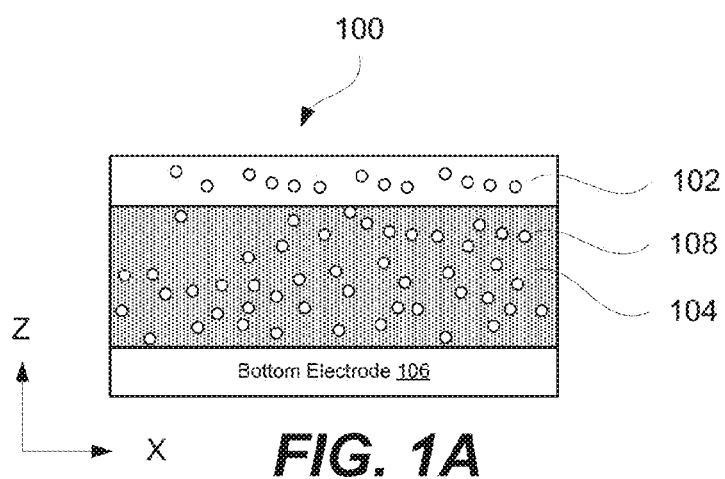
FIGS. 1A-1C illustrate a schematic representation of a ReRAM operation according to some embodiments.
Figure 1B:
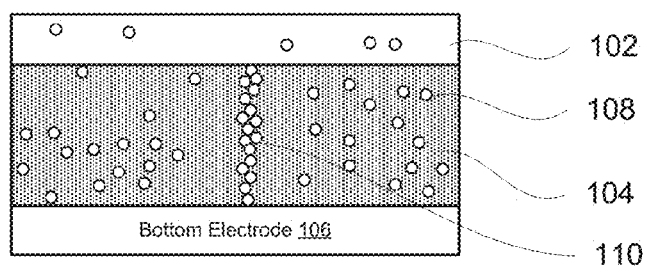
Figure 1C:
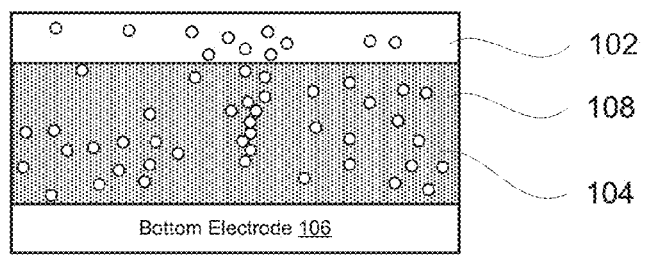

FIGS. 1A-1C illustrate a schematic representation of a ReRAM operation according to some embodiments. A basic building unit of a memory device is a stack having a capacitor like structure. A ReRAM cell includes two electrodes and a dielectric positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, selector element, and other components.

Top electrode 102 and bottom electrode 106 may be used as conductive lines within a memory array or other types of devices integrated with the ReRAM. As such, electrode 102 and 106 are generally formed from conductive materials.

Resistance switching layer 104 which may be initially formed from a dielectric material and later can be made to conduct through one or more conductive paths formed within the layer by first applying a forming voltage and then applying a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects).

In some embodiments, these defects may be utilized for ReRAM cells operating according to a valence change mechanism, which may occur in specific transition metal oxides, nitrides, and oxy-nitrides. For example, defects may be oxygen vacancies triggered by migration of oxygen anions. Migrations of oxygen anions correspond to the motion of corresponding oxygen vacancies that are used to create and break conductive paths. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, (i.e., reduction or oxidation). Other resistive switching mechanisms include bipolar electrochemical metallization mechanisms and thermochemical mechanisms, which lead to a change of the stoichiometry due to a current-induced increase of the temperature. Some of these mechanisms will be further described below with reference to FIGS. 1A-1C.

Specifically, FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to the forming operation and all defects are provided from top electrode 102 during forming. Bottom electrode 106 may or may not have any defects.

During the forming operation, ReRAM cell 100 can change its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths 110 as schematically shown in FIG. 1B. For simplicity, all these phenomena are collectively referred to as reorientation of defects within ReRAM cell 100. This reorientation of defects 108 occurs when a forming voltage 104 is applied to electrodes 102 and 106. In some embodiments, the forming operation is also conducted at elevated temperatures to enhance the mobility of the defects within ReRAM cell 100. In general, the forming operation is considered to be a part of the fabrication of ReRAM cell 100, while subsequent resistive switching is considered to be a part of operation of ReRAM cell.

Resistive switching involves breaking and reforming conductive paths through resistive switching layer 104, for example switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or re-formed. These voltages may be substantially lower than forming voltages (i.e., voltages used in the forming operation) since less mobility of defects is needed during switching operations.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to the different number and/or conductivity of conductive paths that exists in these states, (i.e., resistive switching layer 104 has more conductive paths and/or less resistive conductive paths when it is in the LRS than when it is in the HRS). It should be noted that resistive switching layer 104 may still have some conductive paths while it is in the HRS, but these conductive paths are fewer and/or more resistive than the ones corresponding to the LRS.

When switching from its LRS to HRS, which is often referred to as a "reset" operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self-limiting process, (i.e., the process may stop after some initial breakage occurs).

When switching from its HRS to LRS, which is often referred to as a "set" operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Some examples of cells that exhibit unipolar switching behavior include resistive switching layers formed from most metal oxide materials and having inert electrodes at both sides, (e.g., Pt/MeO$_x$/Pt where "MeOx" represents a generic metal (Me) oxide material). Alternatively, a voltage applied to electrodes 102 and 104 during the set operation may have different polarity as a voltage applied during the reset operation. This type of switching is referred to as bipolar switching. Some examples of cells that exhibit bipolar switching behavior include resistive switching layers formed from metal oxide materials and having one inert electrode and one reactive electrode, (e.g., TiN/MeOx/Pt and TiN/MeOx/poly-Si). Setting and resetting operations may be repeated multiple times as will now be described with reference to FIGS. 2A and 2B.

Figure 2A:
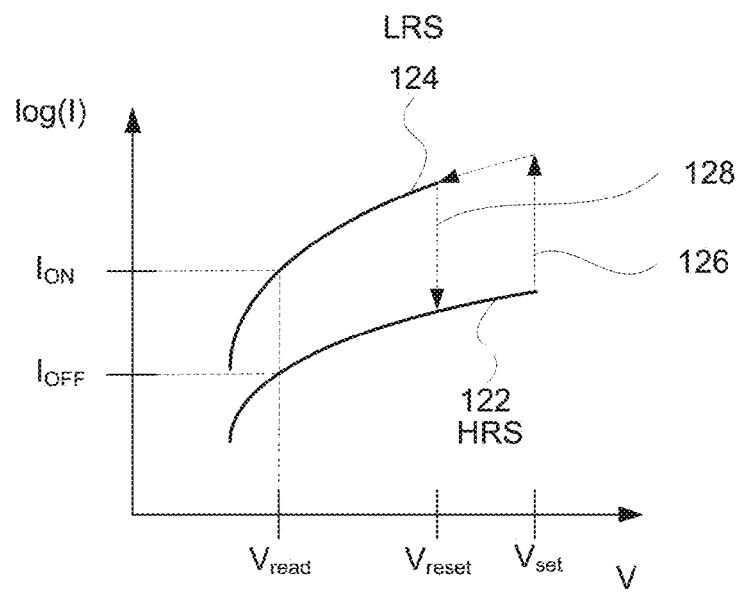
FIG. 2A illustrates a plot of a current passing through a unipolar ReRAM cell as a function of a voltage applied to the ReRAM cell, in accordance with some embodiments. FIG.
Figure 2B:
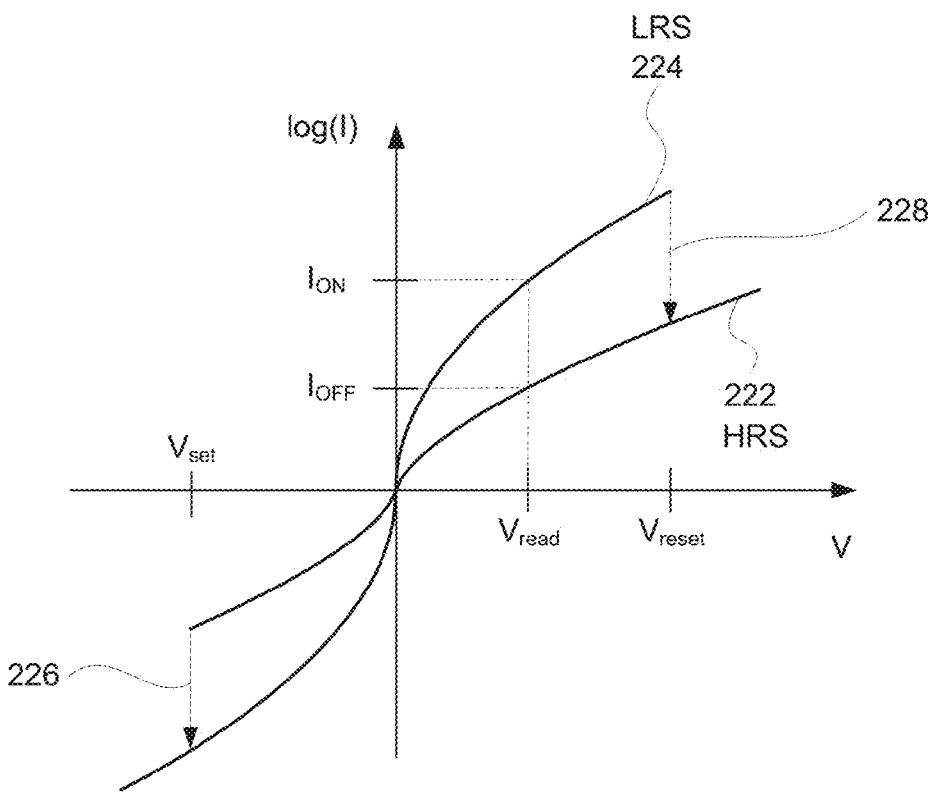

FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in FIG. 2A and by lines 222 and 224 respectively in FIG. 2B. Each of these states is used to represent a different logic state, (e.g., the HRS may represent logic one ("1") and LRS representing logic zero ("0") or vice versa). Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a "read" operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance switching layer can be sensed by applying a sensing voltage to its electrodes. The sensing voltage is sometimes referred to as a "READ" voltage or simply a reading voltage and indicated as $V_{READ}$ in FIGS. 2A and 2B. If the ReRAM cell is in its HRS (represented by lines 122 and 222 in FIGS. 2A and 2B), the external read and write circuitry connected to the electrodes will sense the resulting "OFF" current ($I_{OFF}$) that flows through the ReRAM cell. As discussed previously, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistance switching layer as described above with reference to FIGS. 1B and 1C. The switching from the HRS to LRS is indicated by dashed lines 126 and 226 in FIGS. 2A and 2B. The resistance characteristics of the ReRAM cell in its LRS are represented by lines 124 and 224 respectively. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistance switching layer. Switching from a LRS to HRS is indicated by dashed line 128 in FIG. 2A and line 228 in FIG. 2B. Detecting the state of the ReRAM cell while it is in its HRS is described above.

It should be noted that polarity of the reset voltage and the set voltage may be the same as shown in FIG. 2A or different as shown in FIG. 2B. The cells that have the same polarity of set and reset voltages are referred to as unipolar cells, while the cells that have different polarities of set and reset voltages are referred to as bipolar cells. Without being restricted to any particular theory, it is believed that unipolar switching occurs due to metallic filament formation and destruction caused by resistive heating and application of electrical field. Bipolar switching is believed to be based on filaments formed from oxygen vacancies. The formation and rupture of the filaments is accomplished by oxygen vacancy movement. The switching voltages of unipolar and bipolar switching are typically comparable. However, the endurance of bipolar devices is generally better than that of unipolar devices.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 12V or, more specifically, between about 500 mV and 5V. In some embodiments, the read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers The ReRAM cells can be configured in a cross point memory array. The cross point memory arrays can include horizontal word lines that cross vertical bit lines. Memory cells can be located at the cross points of the word lines and the bit lines. The memory cells can function as the storage elements of a memory array.

FIG. 3 illustrates a memory array of resistive switching memory elements according to some embodiments. Memory array 300 may be part of a memory device or other integrated circuit. Memory array 300 is an example of potential memory configurations; it is understood that other configurations are possible.

Read and write circuitry (not shown) may be connected to memory elements 302 using signal lines 304 and orthogonal signal lines 306. Signal lines such as signal lines 304 and signal lines 306 are sometimes referred to as word lines and bit lines and are used to read and write data into the elements 302 of array 300. Individual memory elements 302 or groups of memory elements 302 can be addressed using appropriate sets of signal lines 304 and 306. Memory element 302 may be formed from one or more layers 308 of materials, as is described in further detail below, and may include additional elements such as those described below, including selection or control elements.

One having ordinary skills in the art would understand that other arrangements of memory cells are possible; in particular, a memory array can be a 3-D memory array. For example, several 2-D memory arrays (as shown in FIG. 3) can be stacked in a vertical fashion to make multi-layer 3-D memory arrays. As another example, one set of signal lines can be composed of vertical lines, and the other set of signal lines can be a composed of one or more subsets of horizontal lines, the subsets (if applicable) being positioned at an angle (e.g. orthogonally) to each other, and the memory devices can be formed as substantially concentric cylindrical layers around the vertical lines.

Any suitable read and write circuitry and array layout scheme may be used to construct a non-volatile memory device from resistive switching memory elements such as element 302. For example, horizontal and vertical lines 304 and 306 may be connected directly to the terminals of resistive switching memory elements 302. This is merely illustrative.

During the operation of the cross point memory array, such as a read operation, the state of a memory element 302 can be sensed by applying a sensing voltage (i.e., a "read" voltage) to an appropriate set of signal lines 304 and 306. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a switching operation, the state of a memory element can be changed by application of suitable switching signals to an appropriate set of signal lines 304 and 306.

Ideally, only the selected memory cell, (e.g., during a read operation), can allow a current to flow. However, currents, (often referred as sneak path currents), can flow through unselected memory elements during the read operation. The sensing of the resistance state of a single memory cell can be unreliable. For example, all memory cells in the array are coupled together through many parallel paths. The resistance measured at one cross point can include the resistance of the memory cell at that cross point in parallel with resistances of the memory cells in the other rows and columns.

FIG. 4 illustrates sneak path currents in a cross point memory array according to some embodiments. Sneak path currents can exist concurrently with operating current when a voltage is applied to the cross point memory array. A memory cell 410 can be selected, for example, for a read operation, by applying a voltage to signal line 430, and grounding signal line 440. A sensing current 415 can flow through the memory cell 410. However, parallel current paths, (e.g., sneak path current), can exist, for example, represented by a series of memory cells 420A, 420B, and 420C. The applied voltage (signal line 430) can generate a current 425 through memory cells 420A-420C, and return to ground (signal line 440). The sneak path current 425 can be particularly large, (e.g., larger than the sensing current 415), when the selected cell 410 is in a high resistance state and the neighboring cells (e.g. 420A-420C) are in a low resistance state.

There can be multiple sneak path currents 425, and the resistances of the series memory cells 420A-420C can be smaller than that of the selected memory cell 410, this can obscure the sense current 415 through the selected memory cell 410 during a read operation.

To reduce or eliminate the sneak path occurrence, a control device, (e.g., a selector), can be used in the cross point memory array. For example, a diode can be located in each memory cell. The control device can isolate the selected memory cell from unselected memory cells by breaking parallel connections of the memory cells.

The sneak path current 425 can include currents in an opposite direction as compared to the sensing current. For example, as seen in FIG. 4, sneak path current 425 passes through memory device 420B in an opposite direction, (e.g., upward), as compared to the sensing current 415 passing through the selected memory cell 410. Thus a one-way electrical device, such as a diode, can be used to block the sneak current path 425. For example, a diode can be added to each memory device, (e.g., memory devices 410, and 420A-420C), thus allowing currents to pass only in one direction. As an example, the diodes can be incorporated into the memory devices so that the current can only pass in a downward direction in FIG. 4. With the incorporation of diodes, the sneak path current can be blocked, for example, at memory device 420B.

In some embodiments, control elements for lower current values through a memory element, for example, during a read operation or a set or reset operation, are provided. The current for the memory element can be reduced at lower than the operating voltages, such as a read voltage, while still maintaining appropriate current at the switching voltages ($V_s$) to avoid interfering with the memory device operation. In some embodiments, the current density can be small, (e.g., <$10^{-3}$ A/cm$^2$), at half of the switching voltage ($V_s/2$) to prevent modification to the memory array. The low current at half the switching voltage can ensure that when $V_s/2$ is applied to selected cell, (e.g., $V_s/2$ is applied to a selected row and $-V_s/2$ is applied to a selected column), the other cells on the selected row and column are not programmed or disturbed. The current selector thus should have high resistance at $V_s/2$. In some embodiments, the current density can be large, (e.g., ~$10^6$-$10^8$ A/cm$^2$), at the switching voltage, (e.g., set or reset voltage) to allow switching of the memory cells. In other words, the current selector can have very low resistance at $V_s$ to ensure that the voltage drop across the current selector can be minimal during the memory cell programming.

In some embodiments, selector elements (e.g. a MSM selector device) for a non-linear current response of a memory element are provided. At low voltages, (e.g., lower than the switching voltages or at half a switching voltage), the current can be significantly reduced, while the current can remain the same or can be controlled to ensure proper operation of the memory devices. The lower current values at low voltages can also reduce power consumption and thus improve the power efficiency of the memory array.

FIG. 5 schematically illustrates sneak path currents in a cross point memory array according to some embodiments. A memory cell 522 can be selected, for example, for a read operation, by applying a voltage to signal line 530, and grounding signal line 540. A current can flow through the memory cell 522. However, parallel current paths, (e.g., sneak path current), can exist, for example, represented by a series of memory cells 524, 526, and 528. The applied voltage (signal line 530) can generate a current 514 through memory cell 524, passing through memory cell 526, and returning to the ground (signal line 540) through memory cell 528.

There are multiple sneak path currents, and the resistances of the series memory cells can be smaller than that of the selected memory cell. This can obscure the sense current through the selected memory cell during a read operation.

To reduce or eliminate the sneak path currents, a control element, (e.g., a selector element), can be used in the cross point memory array. For example, a series transistor or a diode can be located in a memory cell. The control device can isolate the selected memory cell from unselected memory cells by breaking parallel connections of the memory cells.

A resistive memory element can require a minimum set current to cause the memory element to switch from a high resistance state, (e.g., "0" state), to a low resistance state, (e.g., "1" state). In practice, the difference between the applied set current and the minimum set current is much larger than necessary to cause the device to reliably switch to the logic "1" state, (e.g., low resistance state). Further, it has been found that the magnitude of the current required to switch the memory element to a high resistance state from a low resistance state can be dependent on the magnitude of the current used to set the device in the low resistance state. If a high set current is used, then a higher "reset" current is required to achieve a desirable high resistance state. In other words, the difference between the applied reset current and the minimum reset current also needs to be larger than necessary to cause the device to switch from the "1" to the "0" state if the magnitude of the prior applied set current is too far from the minimum set current.

The larger than necessary swings in the current used to switch between the "1" and "0" states can damage the materials and components in the switching memory device, thus affecting the memory element's lifetime and reliability.

In some embodiments, the control element can be provided so that its impedance can limit the current through the memory element to a value that is just greater than the minimum set current, and still allow the "1" logic state to be reliably set by the applied $V_{SET}$ voltage. It is believed that the control element can also help reduce the apparent minimum set current, since the control element impedance can reduce the swing in current between the set and reset switching currents at the same fixed applied voltage, thus affecting the density and movement of the traps in the variable resistance layer. Not intending to be bound by theory, but it is believed that when a smaller "1" state switching current is applied to a device, that the formed filaments, or aligned traps, in the variable resistance layer will be smaller in size than if a higher "1" current is applied, thus making the filaments easier to alter during the reset phase of the resistive switching process.

In some embodiments, control elements for lower current values through a memory element, (e.g. during a read operation or a set or reset operation), are provided. The current for the memory element can be reduced at lower than the switching voltages, (e.g. such as a read voltage), while still maintaining appropriate current at the switching voltages to avoid interfering with the memory device operations. A control element can be optimized for one or more operations (e.g. such as read, set, and/or reset) that is performed at a specific switching voltage ($V_s$), but can be compatible with other operations. In some embodiments, the current can be small, (e.g., between $10^{-10}$ and $10^{-6}$ A/cm$^2$), at half of the switching voltage ($V_s/2$) to prevent modification to the memory array. For high density memory devices, higher leakage currents can be acceptable, (e.g. such as less than $10^3$ A/cm$^2$) for less than 10 micron size devices. The low current at half the switching voltage can ensure that when $V_s$ is applied to a selected cell, and smaller voltages are applied to other cells in the same row or column, the other cells are not accidentally programmed and/or disturbed. Further, the state of the other cells does not substantially affect the desired operation on the selected cell (such as the value of the sensed current during a read operation). For example, one way to perform an operation (such as a read operation) can be by applying $V_s/2$ to a selected row and $-V_s/2$ to a selected column, and grounding other rows and columns, so that the full operating voltage $V_s$ is applied to the selected cell, and a smaller voltage $V_s/2$ is applied to other cells on the selected row and column. Other methods of applying $V_s$ to the selected cell (e.g. during a read operation) may be preferred, but in general they all may potentially subject a large number of cells, or even the majority the cells in the array, to non-zero voltages no larger than $V_s/2$. The current selector thus can have high resistance at and below $V_s/2$ but much smaller resistance at the operating voltage $V_s$ and above.

In some embodiments, the current can be large, (e.g., between $10^{-3}$ and $10^3$ A/cm$^2$, or between $10^1$ and $10^3$ A/cm$^2$), at voltages equal to (or higher than) the operating voltage. For high density memory devices, higher currents can be achieved, such as between $10^6$ and $10^7$ A/cm$^2$ for less than 10 micron size devices. For example, to allow switching of the memory cells, the currents should reach these values when sufficient voltages are applied to the switching layer. The voltage applied to the switching layer can be different (e.g., much larger) than the voltage that falls across the control element. Because the selector element can be electrically in series with the switching layer, these high currents can flow through the selector element, and thus, the portion of the voltage that falls across the selector element during set and/or reset operations can be substantially higher than $V_s/2$, for example, it can be around or slightly above the switching voltage $V_s$. If a much larger voltage falls across the selector element while high currents are flowing through it, the Joule heating can lead to unintended thermal damage. In other words, the selector element can have very low resistance at $V_s$ to ensure that the voltage drop across the selector element can be minimal during the memory cell programming despite the high current levels.

FIGS. 6A-6B illustrate examples of I-V response for a selector element according to some embodiments. These plots are given as an illustration and are not assuming any particular scale for the axes. In FIG. 6A, an I-V curve for a selector element employed in a unipolar device is shown. The current can start from low current (substantially zero current)

at zero voltage, and can increase until the on-state voltage $V_{on\text{-}state}$, which can be as high as the read voltage $V_{READ}$ or even higher. The current will continue to increase up to the highest voltage used for any operation, such as $V_{SET}$. The current can slowly increase for low voltages that are less than $V_{off\text{-}state}$, (e.g., less than $V_s/2$), and then rapidly increase toward the on-state voltage $V_{on\text{-}state}$. The low current at the vicinity of zero voltage can reduce the leakage current. For example, the current 630 at half the switching voltage can be less than about $10^{-6}$ A/cm$^2$, such as between $10^{-10}$ A/cm$^2$, and $10^{-6}$ A/cm$^2$, to prevent accidental changes to the memory cells. At high voltages, such as at the switching voltage $V_s$, the current can be very high to prevent any interference with the operation of the memory devices. For example, the current 620 at the operating voltage can be higher than about $10^{-3}$ A/cm$^2$, such as between $10^{-3}$ A/cm$^2$, and $10^3$ A/cm$^2$, or higher than about $10^1$ A/cm$^2$, such as between $10^1$ and $10^3$ A/cm$^2$, so that the voltage drop across the selector element is small. At opposite polarity voltages, the current 640 can be small, (e.g., negligible), to be used as a diode for unipolar memory cells. For smaller memory sizes, such as less than 10 microns, higher leakage values (e.g., $10^3$ A/cm$^2$) at low voltages can be allowed, and higher current values (e.g., $10^{6-7}$ A/cm$^2$) at high voltages can be required. Note that the specific target current densities may depend on the dimensions of the device and the material used in the switching element; the above numbers are cited as examples and are not intended to be limiting.

FIG. 6B shows a current response for a selector element that can be used for bipolar memory cells, (Note: the absolute value of current is shown, regardless of the current direction). The current response curve can be similar in both positive and negative polarities. For example, for the positive voltages, the current can be small 630 at $V_{off\text{-}state}$, and very large 620 at $V_{on\text{-}state}$. For the negative voltages, the current behavior can be similar, (e.g., small 635 at $V_{off\text{-}state1}$, and large 625 at $V_{on\text{-}state1}$). As shown, both curves are plotted on the upper half of an I-V coordinate, but in general, the left half can be plotted on an (-I)-(-V) axis while the right half can be plotted on I-V axis. This approach can account for a linear-log plot, for example, with the voltage axis being linear and the current axis being logarithm.

In some embodiments, the curves can be symmetrical, (e.g., $V_{off\text{-}state}=V_{off\text{-}state1}$ and $V_{on\text{-}state}=V_{on\text{-}state1}$). For example, in a bipolar memory cell, the set voltage $V_{set}$ and reset voltage $V_{reset}$ can have a same magnitude with opposite polarities. In some embodiments, the curves can be asymmetrical, (e.g., $V_{on\text{-}state} \neq V_{on\text{-}state1}$).

In some embodiments, designs for selector elements for resistive memory devices are provided. A selector element can be based on tunneling and/or thermionic conduction in the on-state, with minimum leakage in the off-state. At low voltages, the current can be significantly reduced, while the current can remain the same or can be controlled to ensure proper operation of the memory devices. The lower current values at low voltages can also reduce power consumption and thus improve the power efficiency of the memory arrays. In some embodiments, the ratio of on-current to off-currents can be large (e.g., >$10^4$) with a high on-current (e.g., greater than $10^1$ A/cm$^2$ for large area memory devices and greater than $10^3$ or $10^6$ A/cm$^2$ for small area memory devices).

In some embodiments, the memory device including a memory element and a selector element can be used in a memory array, such as a cross point memory array. For example, the selector element can be fabricated on the memory element, forming a columnar memory device, which can be placed at the cross points of the word lines and bit lines.

FIG. 7 illustrates a cross point memory array according to some embodiments. A switching memory device can include a memory element 720 and a selector element 725, which are both disposed between the electrodes 730 and 740. The selector element 725 can be an intervening electrical component, disposed between electrode 730 and memory element 720, or between the electrode 740 and memory element 720. In some embodiments, the selector element 725 may include one or more additional layers of materials.

Leakage current in dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the thermally activated flow of charge over an energy barrier whereby the effective barrier height of a MIM capacitor controls leakage current. The nominal barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through direct tunneling without any intermediary interaction with defects. As such, the Fowler-Nordheim emission behavior of a dielectric layer is generally determined by the physical thickness of the dielectric layer.

In some embodiments, a selector element for a cross point memory array is provided, wherein the cross point memory array includes one of MRAM, FRAM, PCM, STT-RAM, or ReRAM. In some embodiments, the selector element includes one of a metal-insulator-metal (MIM), metal-insulator-insulator-insulator-metal (MIIIM), metal-semiconductor-metal (MSM), metal-semiconductor-semiconductor-semiconductor-metal configuration (MSSSM), or metal-insulator-semiconductor-insulator-metal (MISIM) (e.g. stacks of layers). The selector element is designed to exhibit substantially symmetric I-V behavior (e.g. bipolar behavior as discussed previously). In some embodiments, the switching voltage (e.g. $V_s$) of the cross point memory array is between about 3V and about 5V (or between −3V and −5V for the negative polarities). In some embodiments, the switching voltage of the cross point memory array is about 4V. The selector element is designed to have leakage current density values between about $10^6$ A/cm$^2$ and $10^8$ A/cm$^2$ over these voltage ranges. The selector element is designed to have leakage current density values that are lower at voltages that are less than about half of the switching voltage (e.g. $V_s/2$). Advantageously, the ratio of the leakage current density at the operating voltage (e.g. J at $V_s$) to the leakage current density at half of the operating voltage (e.g. J at $V_s/2$) is on the order of $10^6$-$10^8$. These design criteria give a non-linearity factor of about 4 decades/volt over the voltage range between $V_s/2$ and V. The selector element is designed so that the stack does not exhibit irreversible breakdown behavior when stressed by voltages up to and slightly greater than $V_s$.

The leakage current through semiconductor materials may also exhibit non-linear behavior. Therefore, a metal-semiconductor-metal (MSM) control element (or MSSSM or MISIM) may be formed within each memory cell of a cross-bar memory array (e.g. similar to the MIM control elements discussed previously). The leakage current is low or increases slowly for voltages below a threshold voltage ($V_{Threshold}$). In this voltage range, the selector element has a high resistance and the leakage current is low, or increases only slowly. Above the threshold voltage, the resistivity of the selector element decreases and the selector element may exhibit snapback, wherein the voltage across the selector element decreases to a lower value (e.g. $V_{Hold}$) because the resistance of the selector element suddenly decreases. The mechanisms involved in snapback behavior are not well understood. As discussed with respect to FIG. 7, the selector element and the memory element are arranged in series within each memory cell. At voltages greater than the threshold voltage, the selector element passes most of the current through to the memory element. This behavior allows higher voltages such as $V_{set}$ and $V_{reset}$ to be applied to the memory element (e.g. a MRAM element, FRAM element, PCM element, STT-RAM element, ReRAM element, or others) to change the state of the memory element.

FIGS. 8A-8B illustrate examples of I-V responses for selector elements according to some embodiments. These plots are given as an illustration and are not assuming any particular scale of the axes. In FIG. 8A, a current voltage response, (e.g., I-V curve), for a selector element employed in a unipolar device is shown. The current can start from low current (substantially zero current) at zero voltage, and can increase until the threshold voltage $V_{Threshold}$ is reached along line 820. As discussed previously, when the threshold voltage is reached, the semiconductor material exhibits snapback and the voltage across the selector element decreases as illustrated by line 830. As the voltage continues to increase, the current will continue to rise (not shown) as dictated by the resistance of the memory element with only a small influence by the selector element.

FIG. 8B shows a current response for a selector element that can be used for bipolar memory cells, (Note: the absolute value of current is shown, regardless of the current direction). The current response curve can be similar in both positive and negative polarities. The current can start from low current (substantially zero current) at zero voltage, and can increase until the threshold voltage $V_{Threshold}$ is reached along line 820 (or line 822 for negative voltages). As discussed previously, when the threshold voltage is reached, the semiconductor material exhibits snapback and the voltage across the selector element decreases as illustrated by line 830 (or line 832 for negative voltages). As the voltage continues to increase, the current will continue to rise (not shown) as dictated by the resistance of the memory element with only a small influence by the selector element. As shown, both curves are plotted on the upper half of an I-V coordinate, but in general, the left half can be plotted on an (−I)-(−V) axis while the right half can be plotted on I-V axis. This approach can account for a linear-log plot, for example, with the voltage axis being linear and the current axis being logarithm. In some embodiments, the curves can be symmetrical, (e.g., $V_{Threshold}=V_{Threshold-1}$ and $V_{Hold}=V_{Hold-1}$).

FIG. 9 illustrates a schematic representation of an NVM cell 900, in accordance with some embodiments. NVM cell 900 may include first electrode 902, switching layer 904, selector element 906, embedded resistor 908, and second electrode 910. As discussed previously, the NVM cell may be one of MRAM, FRAM, PCM, or ReRAM memory technology. In some embodiments, selector element 906 includes an MSM stack as discussed previously.

In some embodiments, the MSM stack includes a first conductive layer 906A, first interface layer 906B, a semiconductor layer 906C, a second interface layer 906D, and a second conductive layer, 906E. In some embodiments, the first interface layer and the second interface layer may include carbon. In some embodiments, the first conductive layer and the second conductive layer may be one of carbon, tungsten, titanium nitride, or combinations thereof. In some embodiments, the first conductive layer and the second conductive layer may be the same material(s), leading to symmetric behavior. In some embodiments, the first conductive layer and the second conductive layer may be different material(s), leading to asymmetric behavior. The thickness of each of the conductive layers of the MSM stack may be between about 10 nm and about 100 nm, such as about 50 nm.

In some embodiments, the semiconductor layer of the MSM stack includes silicon or doped silicon as discussed previously. The semiconductor layer is typically amorphous (at least in the as-deposited state). In some embodiments, the thickness of the semiconductor layer (e.g. 906C) is between about 10 nm and about 40 nm.

In some embodiments, the thickness of each of the carbon layers (e.g. interface layers 906B and 906D) in the stack is between about 2 nm and about 20 nm. Without being bound by theory, it is believed that the two carbon layers exhibit high conductivity but also serve to prevent metal atoms from the two conductive layers from diffusing into the semiconductor layer. Metal atoms within the semiconductor layer would introduce defects and would degrade the selector performance of the layer.

In some embodiments, NVM cell 900 has more or fewer layers than illustrated in FIG. 9. For example, an intermediate layer may be disposed between selector element 906 and embedded resistor 908 in order, for example, to improve electrical connection between these two components. Similarly, an intermediate layer may be disposed between switching layer 904 and selector element 906 in order, for example, to prevent diffusion of species from selector element 906. First electrode 902 and/or second electrode 910 may be connected to signal lines interconnecting NVM cell 900 with control circuitry and, in some embodiments, with other cells, if, for example, NVM cell 900 is a part of a memory array. Alternatively, first electrode 902 and/or second electrode 910 may be operable as signal lines and, in some embodiments, be shared by other NVM cells. In some embodiments, NVM cell 900 may not include embedded resistor 908. The function of embedded resistor 908 may be performed by other components, such as first electrode 902 and/or second electrode 910.

Furthermore, orientation of layers in NVM cell 900 may be different from the orientation shown in FIG. 9. For example, selector element 906 may be disposed between embedded resistor 908 and second electrode 910. Alternatively, selector element 906 may be disposed between switching layer 904 and first electrode 902.

In some embodiments, NVM cell 900 includes first electrode 902 disposed over substrate 901. Substrate 901 may include other components, such as additional NVM cells forming an array with NVM cell 900. NVM cell 900 also includes switching layer 904 disposed over first electrode 902 such that first electrode 902 is disposed between switching layer 904 and substrate 901. NVM cell 900 also includes selector element 906 disposed over switching layer 904 such that switching layer 904 is disposed between first electrode 902 and selector element 906. NVM cell 900 also includes second electrode 910 disposed over selector element 906 such that selector element 906 is disposed between switching layer 904 and second electrode 910. Also shown in FIG. 9 is optional embedded resistor 908. When present, embedded resistor 908 may be disposed between selector element 906 and second electrode 910 or some other two components of NVM cell 900. It should be noted that selector element 906 and switching layer 904 form a stack between first electrode 902 and second electrode 910 such that selector element 906 and switching layer 904 are connected in series within NVM cell 900.

In some embodiments, the semiconductor layer in the MSM stack of a selector element includes silicon or doped silicon. The semiconductor layer is typically amorphous (at least in the as-deposited state). Amorphous silicon has a band gap of ~1.1 eV (depending on the deposition parameters). The stack is deposited thick enough to suppress direct tunneling (e.g. Fowler-Nordheim mechanisms) at voltages lower than about $V_s/2$. In some embodiments, the thickness of the semiconductor layer is between about 10 nm and about 40 nm, such as less than about 30 nm.

The two conductive layers within the MSM stack may exhibit good electrical conductivity. Further, the conductivity of the materials (e.g. carbon, tungsten, or titanium nitride) can be tuned by altering the composition and/or processing conditions. Therefore, the resistivity of the MSM stack can be tailored to match the device performance requirements. In some embodiments, the thickness of each of the conductive layers is between about 10 nm and about 100 nm, such as about 50 nm. As discussed previously, when the MSM selector element undergoes a "snapback" event, the current that flows though the element increases. This increase in current flow may form traps and/or defects within the semiconductor layer. Additionally, a significant amount of Joule heating may be introduced into the layer. This Joule heating may lead to the diffusion of metals from electrode materials adjacent to the MSM stack to diffuse into the semiconductor layer. Metal atoms within the semiconductor layer would introduce defects and would degrade the selector performance of the layer. These conditions may serve to degrade the performance of the selector element over time (e.g. poor reliability and/or poor endurance performance).

In some embodiments, the two conductive layers of the MSM stack include the same material. In some embodiments, the two conductive layers of the MSM stack include different materials. The symmetry of the stack results in symmetric I-V behavior under bipolar operation. However, conductive layers with different compositions can be selected to distort the symmetry of the I-V behavior if so desired.

FIG. 10 illustrates an example of an NVM cell according to some embodiments. The NVM cell, 900, (e.g. structures 902, 904, 906, 908, and 910) is as discussed previously with respect to FIG. 9. Without being bound by theory, one possible mechanism for the snapback discussed previously involves the sudden generation of electron-holes pairs in the semiconductor material of the MSM stack, leading to an increase in the conductivity of the layer. This mechanism will depend on the threshold voltage ($V_{th}$) or associated thermal process required to generate the electron-hole pairs and on the current flowing through the MSM stack. These two parameters will be coupled, in that increasing one will tend to decrease the other. It would be advantageous to decouple these two parameters to allow greater device design flexibility.

In some embodiments, methods to decouple the $V_{th}$ and the current involve the use of either electro-luminescent or photo-luminescent materials. Those skilled in the art will understand that these materials emit photons in response to the application of current or applied voltage (e.g. electro-luminescence) or to their irradiation by electromagnetic radiation (e.g. photo-luminescence). These photons can be absorbed by the semiconductor layer of the MSM stack and thereby create electron-hole pairs. In this manner, at least a portion of the generation of the electron-hole pairs can be decoupled from the threshold voltage ($V_{th}$) required to generate the electron-hole pairs and on the current flowing through the MSM stack. As an example, the $V_{th}$ may be modulated or selected by varying the timing and/or the intensity of the application of either the electro-luminescent or photo-luminescent materials.

FIG. 10 illustrates a generic spatial configuration for the use of electro-luminescent materials as part of a Selector element in a NVM memory cell. The luminescent structure, 1000, includes a first electrode, 1002, a luminescent layer, 1004, (e.g. an electro-luminescent material), and a second electrode, 1006. The details of the luminescent structure are illustrated generically as these are well known semiconductor elements that may be incorporated into the circuit design. The luminescent layer, 1004, is physically aligned with at least the semiconductor layer (e.g. layer 906C in FIG. 9) of the Selector element, 906. The two layers (e.g. 1004 and 906) are separated by a transparent insulator layer, 1008. Those skilled in the art will understand that FIG. 10 is a simple schematic and does not represent an actual device design. Implementations of the embodiments discussed herein are within the skill of general device designers.

In some embodiments, the luminescent material is an electro-luminescent material. In some embodiments, the electro-luminescent material includes one of doped zinc sulfide, indium phosphide, gallium arsenide, or gallium nitride. In some embodiments, a dopant in the zinc sulfide includes at least one of copper, silver, or manganese. The thickness of the luminescent material may be between about 5 nm and about 50 nm.

In some embodiments, each of the electrode layers (e.g. 1002 and 1006) includes conductive materials such as tungsten, copper, tantalum nitride, or titanium nitride. The thickness of each of the electrode layers (e.g. 1002 and 1006) may be between about 10 nm and about 100 nm.

In some embodiments, a transparent insulator layer (e.g. 1008) separates the luminescent material from the semiconductor layer of the MSM stack (e.g. 906C). In some embodiments, the transparent insulator layer includes one of silicon oxide (e.g. $SiO_x$) or silicon nitride (e.g. $SiN_y$). The thickness of the transparent insulator layer may be between about 2 nm and about 10 nm.

In some embodiments, as a voltage applied to the MSM Selector element approaches a desired threshold voltage (e.g. a desired snapback voltage), current or voltage can be independently applied to the luminescent structure, 1000. As discussed previously, the electro-luminescent material, 1004, will emit photons (e.g. illustrated as 1010). These photons will pass through the transparent insulator, 1008, and be absorbed by the semiconductor layer (e.g. 906C) of the MSM Selector element. The absorption of these photons will create additional electron-hole pairs within the semiconductor material, independent of the voltage applied to the MSM Selector element. As discussed previously, this may initiate the snapback event at a voltage lower than if the luminescent structure was not present and activated. The ability to initiate the snapback event at lower voltages may allow the MSM Selector element to be designed with thicker layers, leading to lower OFF currents, improved reliability, and improved endurance.

FIG. 11 illustrates a generic spatial configuration for the use of photo-luminescent materials as part of a Selector element in a NVM memory cell. The luminescent structure, 1100, includes a light source (e.g. light emitting diode (LED), laser, etc.), 1102, and a luminescent layer, 1104, (e.g. a photo-luminescent material). The details of the light source are not illustrated as these are well known semiconductor elements that may be incorporated into the circuit design. The luminescent layer, 1104, is physically aligned with at least the semiconductor layer (e.g. layer 906C in FIG. 9) of the Selector element, 906. The two layers (e.g. 1104 and 906) are separated by a transparent insulator layer, 1108. Those skilled in the art will understand that FIG. 11 is a simple schematic and does not represent an actual device design. Implementations of the embodiments discussed herein are within the skill of general device designers.

In some embodiments, the luminescent material is a photo-luminescent material. In some embodiments, the photo-luminescent material includes one of doped silica, doped titania, indium phosphide, or gallium arsenide, or gallium nitride. In some embodiments, a dopant in the doped silica or doped titania includes at least one of the rare earth elements (e.g. La, Ce, Pr, Nd, Pm, Sm, Eu, Gd, Tb, Dy, Ho, Er, Tm, Yb, Lu, Sc, or Y). The thickness of the luminescent material may be between about 5 nm and about 50 nm.

In some embodiments, a transparent insulator layer (e.g. 1108) separates the luminescent material from the semiconductor layer of the MSM stack (e.g. 906C). In some embodiments, the transparent insulator layer includes one of silicon oxide (e.g. $SiO_x$) or silicon nitride (e.g. $SiN_y$). The thickness of the transparent insulator layer may be between about 2 nm and about 10 nm.

In some embodiments, as a voltage applied to the MSM Selector element approaches a desired threshold voltage (e.g. a desired snapback voltage), the light source, 1100, may be activated. As discussed previously, the electro-luminescent material, 1104, will emit photons (e.g. illustrated as 1110). These photons will pass through the transparent insulator, 1108, and be absorbed by the semiconductor layer (e.g. 906C) of the MSM Selector element. The absorption of these photons will create additional electron-hole pairs within the semiconductor material, independent of the voltage applied to the MSM Selector element. As discussed previously, this may initiate the snapback event at a voltage lower than if the light source was not present and activated. The ability to initiate the snapback event at lower voltages may allow the MSM Selector element to be designed with thicker layers, leading to lower OFF currents, improved reliability, and improved endurance.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A nonvolatile memory cell comprising:
   a first electrode layer;
   a resistive switching layer disposed over the first electrode and operable to switch between at least two resistive state when a switching voltage is applied to the resistive switching layer;
   a selector element disposed over the resistive switching layer;
      wherein the selector element comprises a first conductive layer, a semiconductor layer, and a second conductive layer such that the semiconductor layer is disposed between the first conductive layer and the second conductive layer;
   a second electrode layer disposed over the selector element,
      wherein the resistive switching layer and the selector element form a stack disposed between the first electrode layer and the second electrode layer such that the resistive switching layer and the selector element are connected in series between the first electrode layer and the second electrode layer; and
   a luminescent structure comprising a transparent insulator layer and a luminescent layer,
      wherein the transparent insulator layer is disposed between the luminescent layer and the semiconductor layer of the selector element,
      wherein the luminescent layer is aligned with the semiconductor layer of the selector element in a direction different than a direction of the stack, and
      wherein the semiconductor layer of the selector element is configured to change a concentration of electron-hole pairs when illuminated by the luminescent layer.

2. The nonvolatile memory cell as in claim 1, wherein a thickness of the semiconductor layer is between about 10 nm and about 40 nm.

3. The nonvolatile memory cell as in claim 1, wherein a thickness of the luminescent layer is between about 5 nm and about 50 nm.

4. The nonvolatile memory cell as in claim 1, wherein a thickness of the transparent insulator layer is between about 2 nm and about 10 nm.

5. The nonvolatile memory cell as in claim 1, wherein the first conductive layer comprises one of tungsten, titanium nitride, carbon, or a combination thereof.

6. The nonvolatile memory cell as in claim 1, wherein the second conductive layer comprises one of tungsten, titanium nitride, carbon, or a combination thereof.

7. The nonvolatile memory cell as in claim 1, wherein the first conductive layer and the second conductive layer comprise a same material.

8. The nonvolatile memory cell as in claim 1, wherein the first conductive layer and the second conductive layer comprise a different material.

9. The nonvolatile memory cell as in claim 1, wherein a thickness of each of the first conductive layer and the second conductive layer is between about 10 nm and about 100 nm.

10. The nonvolatile memory cell as in claim 1, wherein a thickness of each of the first conductive layer and the second conductive layer is about 50 nm.

11. The nonvolatile memory cell as in claim 1, wherein the luminescent layer comprises an electro-luminescent material.

12. The nonvolatile memory cell as in claim 11, wherein the electro-luminescent material comprises one of doped zinc sulfide, indium phosphide, gallium arsenide, or gallium nitride.

13. The nonvolatile memory cell as in claim 12, wherein a dopant in the doped zinc sulfide comprises one of copper, silver, or manganese.

14. The nonvolatile memory cell as in claim 1, wherein the luminescent layer comprises a photo-luminescent material.

15. The nonvolatile memory cell as in claim 14, wherein the photo-luminescent material comprises one of doped silica or doped titania, wherein a dopant in the doped silica or doped titania comprises at least one rare earth element.

16. The nonvolatile memory cell as in claim 1, wherein the transparent insulator layer comprises one of silicon oxide or silicon nitride.

17. The nonvolatile memory cell as in claim 1, wherein
   wherein the first electrode layer comprises tungsten;
   wherein the first conductive layer comprises one of carbon, tungsten, titanium nitride, or a combination thereof;
   wherein the luminescent layer comprises one of an electro-luminescent material or photo-luminescent material;
   wherein the transparent insulator layer comprises one of silicon oxide or silicon nitride;

wherein the second conductive layer comprises one of carbon, tungsten, titanium nitride, or a combination thereof; and wherein the second electrode layer comprises tungsten.

18. The nonvolatile memory cell as in claim 17, wherein the electro-luminescent material comprises one of doped zinc sulfide, indium phosphide, gallium arsenide, or gallium nitride.

19. The nonvolatile memory cell as in claim 17, wherein the photo-luminescent material comprises one of doped silica or doped titania, wherein a dopant in the doped silica or in the doped titania comprises at least one rare earth element.

20. The nonvolatile memory cell as in claim 17, wherein the transparent insulator layer comprises silicon oxide.

* * * * *